US 11,710,776 B2

(12) United States Patent
Gauthier et al.

(10) Patent No.: US 11,710,776 B2
(45) Date of Patent: Jul. 25, 2023

(54) BIPOLAR TRANSISTOR

(71) Applicant: STMicroelectronics (Crolles 2) SAS, Crolles (FR)

(72) Inventors: Alexis Gauthier, Meylan (FR); Edoardo Brezza, Grenoble (FR); Pascal Chevalier, Chapareillan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 63 days.

(21) Appl. No.: 17/401,881

(22) Filed: Aug. 13, 2021

(65) Prior Publication Data

US 2022/0059672 A1 Feb. 24, 2022

(30) Foreign Application Priority Data

Aug. 24, 2020 (FR) ...................................... 2008633

(51) Int. Cl.
| | |
|---|---|
| *H01L 29/66* | (2006.01) |
| *H01L 21/762* | (2006.01) |
| *H01L 29/08* | (2006.01) |
| *H01L 29/732* | (2006.01) |

(52) U.S. Cl.
CPC .... *H01L 29/6625* (2013.01); *H01L 21/76224* (2013.01); *H01L 29/0804* (2013.01); *H01L 29/7322* (2013.01)

(58) Field of Classification Search
CPC ........... H01L 29/6625; H01L 21/76224; H01L 29/0804; H01L 29/732; H01L 29/7371
See application file for complete search history.

(56) References Cited

U.S. PATENT DOCUMENTS

| | | |
|---|---|---|
| 3,465,214 A | 9/1969 | Donald |
| 4,887,144 A | 12/1989 | Cook et al. |
| 5,596,221 A | 1/1997 | Honda |
| 6,940,149 B1 | 9/2005 | Divakaruni et al. |
| 9,245,951 B1 | 1/2016 | Camillo-Castillo et al. |
| 9,368,608 B1 | 6/2016 | Camillo-Castillo et al. |
| 10,186,605 B1 | 1/2019 | Gauthier et al. |
| 10,224,423 B1 | 3/2019 | Gauthier et al. |
| 2001/0017399 A1 | 8/2001 | Oda et al. |
| 2002/0053705 A1 | 5/2002 | Kondo et al. |
| 2003/0082882 A1 | 5/2003 | Babcock et al. |
| 2005/0023643 A1 | 2/2005 | Li et al. |
| 2005/0199909 A1 | 9/2005 | Murayama et al. |
| 2007/0275533 A1 | 11/2007 | Vaed et al. |
| 2009/0108373 A1 | 4/2009 | Frank et al. |
| 2010/0276753 A1 | 11/2010 | Greene et al. |
| 2011/0147892 A1 | 6/2011 | Chiu et al. |

(Continued)

FOREIGN PATENT DOCUMENTS

| | | |
|---|---|---|
| EP | 1087424 A1 | 3/2001 |
| FR | 3087048 A1 | 4/2020 |

OTHER PUBLICATIONS

INPI Search Report and Written Opinion for FR Appl. No. 2008633 dated May 7, 2021 (9 pages).

(Continued)

*Primary Examiner* — Syed I Gheyas
(74) *Attorney, Agent, or Firm* — Crowe & Dunlevy (57) ABSTRACT

A bipolar transistor includes a stack of an emitter, a base, and a collector. The base is structured to have a comb shape including fingers oriented in a plane orthogonal to a stacking direction of the stack.

32 Claims, 11 Drawing Sheets

(56) References Cited

U.S. PATENT DOCUMENTS

| | | |
|---|---|---|
| 2011/0159672 A1 | 6/2011 | Chiu et al. |
| 2012/0049319 A1 | 3/2012 | Qian et al. |
| 2012/0181579 A1 | 7/2012 | Chen et al. |
| 2013/0099288 A1 | 4/2013 | Chen et al. |
| 2013/0187198 A1 | 7/2013 | Camillo-Castillo et al. |
| 2013/0270649 A1 | 10/2013 | Chantre et al. |
| 2014/0217551 A1 | 8/2014 | Dunn et al. |
| 2014/0312423 A1 | 10/2014 | Cheng et al. |
| 2014/0319616 A1 | 10/2014 | Baudot et al. |
| 2014/0363960 A1 | 12/2014 | Kim et al. |
| 2015/0108548 A1 | 4/2015 | Dunn et al. |
| 2015/0137186 A1* | 5/2015 | Leidy ................ H01L 29/737 438/318 |
| 2015/0140771 A1 | 5/2015 | Fox et al. |
| 2015/0303189 A1 | 10/2015 | Suzuki |
| 2015/0311911 A1 | 10/2015 | Cheng et al. |
| 2016/0190277 A1 | 6/2016 | Tschumakow et al. |
| 2016/0211345 A1 | 7/2016 | Ding et al. |
| 2016/0380088 A1 | 12/2016 | Camillo-Castillo et al. |
| 2017/0236923 A1 | 8/2017 | Chevalier |
| 2018/0240897 A1 | 8/2018 | Liu et al. |
| 2020/0111889 A1 | 4/2020 | Gauthier et al. |
| 2020/0111890 A1* | 4/2020 | Gauthier ........... H01L 29/66242 |

OTHER PUBLICATIONS

Diop, et al., "Impact of inside spacer process on fully self-aligned 250 GHz SiGe:C HBTs reliability performances: a-Si vs. nitride," Microelectronics Reliability, vol. 48, Issues 8-9, Aug.-Sep. 2008, pp. 1198-1201.

* cited by examiner

BIPOLAR TRANSISTOR

PRIORITY CLAIM

This application claims the priority benefit of French Application for Patent No. 2008633, filed on Aug. 24, 2020, the content of which is hereby incorporated by reference in its entirety to the maximum extent allowable by law.

TECHNICAL FIELD

The present disclosure generally concerns electronic components and, more particularly, bipolar transistors and their manufacturing method.

BACKGROUND

A bipolar transistor is a semiconductor-based electronic device of the transistor family. Its operating principle is based on two PN junctions, one forward-biased and one reverse-biased.

There is a need to improve known bipolar transistors and known bipolar transistor manufacturing methods.

SUMMARY

An embodiment overcomes all or part of the disadvantages of known bipolar transistors and/or of known bipolar transistor manufacturing methods.

An embodiment provides a bipolar transistor comprising a stack of an emitter, a base, and a collector, said base having the structure of a comb with its fingers oriented in a plane orthogonal to the direction of the stack.

According to an embodiment, the transistor comprises a first peripheral insulating trench around said transistor and a second insulating trench delimiting at least the emitter surface.

According to an embodiment, the second insulating trench is shallower than the first insulating trench.

According to an embodiment, the second insulating trench is buried in a first portion of the collector.

According an embodiment, the transistor comprises a second portion of the collector which crosses the second insulating trench at its center, the second portion of the collector being in physical contact with the first portion of the collector.

According to an embodiment, the second insulating trench is filled with air, with a gas, or with a semi-partial vacuum.

According to an embodiment, the second insulating trench is filled with an oxide.

According to an embodiment, the second insulating trench is comb-structured, the structure of the second insulating trench being aligned with the structure of the base.

According to an embodiment, the depth of the second insulating trench is in the order of 50 nm and/or the depth of the first insulating trench is in the order of 100 nm.

According to an embodiment, the transistor comprises contacts on top of and in contact with the emitter, with the base, and with the first portion of the collector.

Another embodiment provides an embodiment comprising a step a) of etching of a base, according to a comb pattern, to form a transistor such as previously defined.

According to an embodiment, the method further comprises the steps of: b) forming a first insulating trench in a substrate; c) forming a second insulating trench, shallower than the first insulating trench, buried in a first portion of a collector; d) forming a second portion of the collector through the second insulating trench, at the center of the second insulating trench, the second portion of the collector being formed on top of and in contact with the first portion of the collector; e) forming a first portion of the base on the second portion of the collector; f) forming a second portion of the base in line with the first portion of the base by partly covering the second insulating trench; and g) forming an emitter on the first portion of the base.

According to an embodiment, the second insulating trench is formed by the opening of the first portion of the collector and then the filling of the opening with an oxide.

According to an embodiment, steps c) and d) are separated by a step h) comprising a full plate depositing of a layer of the material of the second portion of the base and an opening of said layer, the opening having a geometry and a size corresponding to the geometry and to the size of the second portion of the collector.

According to an embodiment, the method comprises a step of forming of contacts on top of and in contact with the emitter, with the second portion of the base, and with the first portion of the collector.

According to an embodiment, the method comprises a step of etching of the material present in the second insulating trench.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
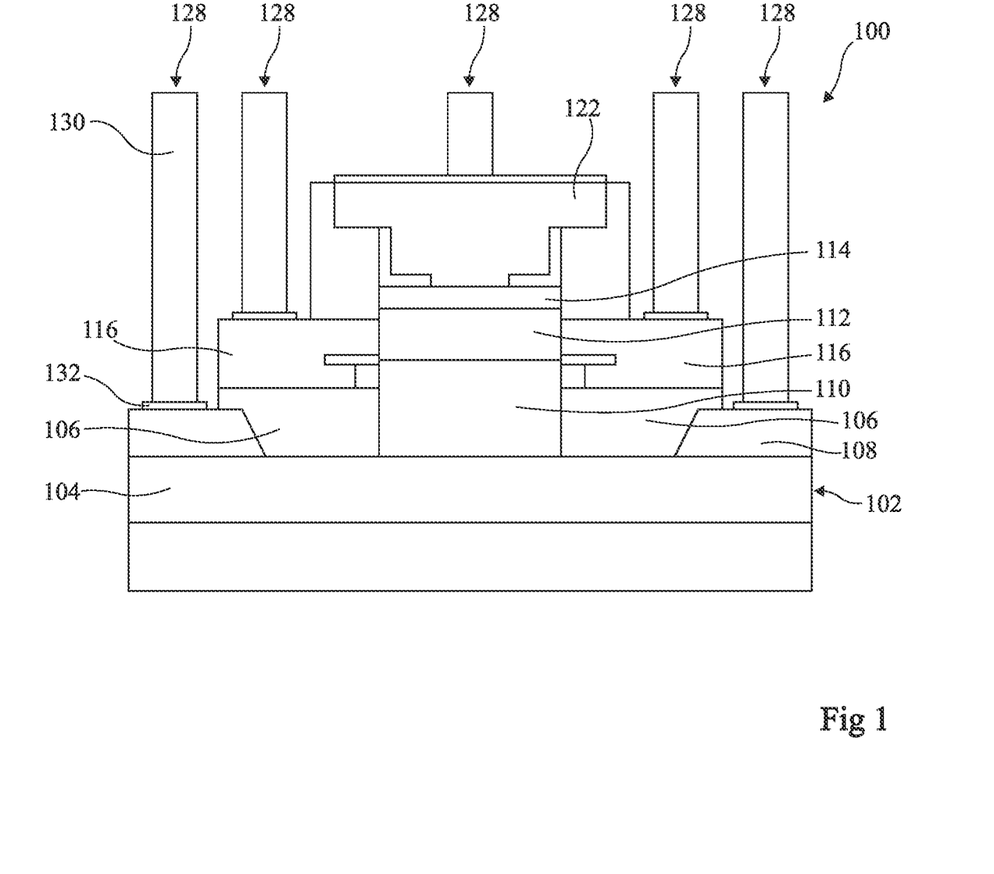
FIG. 1 shows a partial simplified cross-section view of an example of a bipolar transistor.

FIG. 1 shows a partial simplified cross-section view of an example of an NPN bipolar transistor 100.

Transistor 100 is formed inside and on top of a silicon semiconductor substrate 102. Transistor 100 comprises a collector. The collector comprises a first portion 104. First portion 104 is an N-type well buried in substrate 102, that is, under a portion 108 of substrate 102. First portion 104 is doped with arsenic or phosphorus atoms. An insulating trench 106 is located on a portion of well 104. More particularly, insulating trench 106 crosses portion 108 of substrate 102 to reach well 104. The insulating trench is, for example, a super shallow trench isolation (SSTI).

The collector further comprises a second portion 110 crossing insulating trench 106. Insulating trench 106 thus forms a ring around second portion 110. The second portion 110 of the collector is made of an N-doped semiconductor material. The height of the second portion of the collector is such that the second portion protrudes upwards from insulating trench 106 (i.e., the upper surface of the second portion 110 is above the upper surface of the trench 106).

The lower part of second portion 110 of the collector, that is, the part surrounded with insulating trench 106, is in direct physical contact with insulating trench 106 at all points. The lower part of the second portion 110 of the collector and insulating trench 106 are not separated by another material.

The second portion 110 of the collector is covered with a base 112 and with an encapsulation layer 114. Second portion 110, base 112, and layer 114 have substantially equal horizontal dimensions, that is, in top view. The base is a P doped semiconductor material based on silicon, for example, on boron-doped silicon-germanium. Encapsulation layer 114 is made of intrinsic silicon.

Conduction elements 116 made of a P-doped semiconductor material are located on insulating trench 106 and are in physical contact with base 112.

Transistor 100 further comprises an emitter 122. Emitter 122 is an N-doped semiconductor material, for example, doped with arsenic or phosphorus atoms.

Contacts 128, each comprising a conductive via 130 and a contact pad 132, provide an electric contact between different portions of transistor 100 and outer elements via an interconnection network. More particularly, contacts 128 are located on portion 108 of the substrate to form an electric contact with collector 104, 110. Other contacts 128 are formed on conduction elements 116 to form an electric contact with base 112. Other contacts 128 are formed on emitter 122 to form an electric connection with emitter 122.

A transistor such as described hereabove is described in United States Patent Application Publication No. 2020/0111890 (corresponding to FR 3087047), the disclosure of which is incorporated by reference.

It would be desirable, particularly for high-frequency applications (from several GHz to several hundreds of GHz), to decrease the stray capacitances which are present, particularly between the base and the collector.

Figure 2:
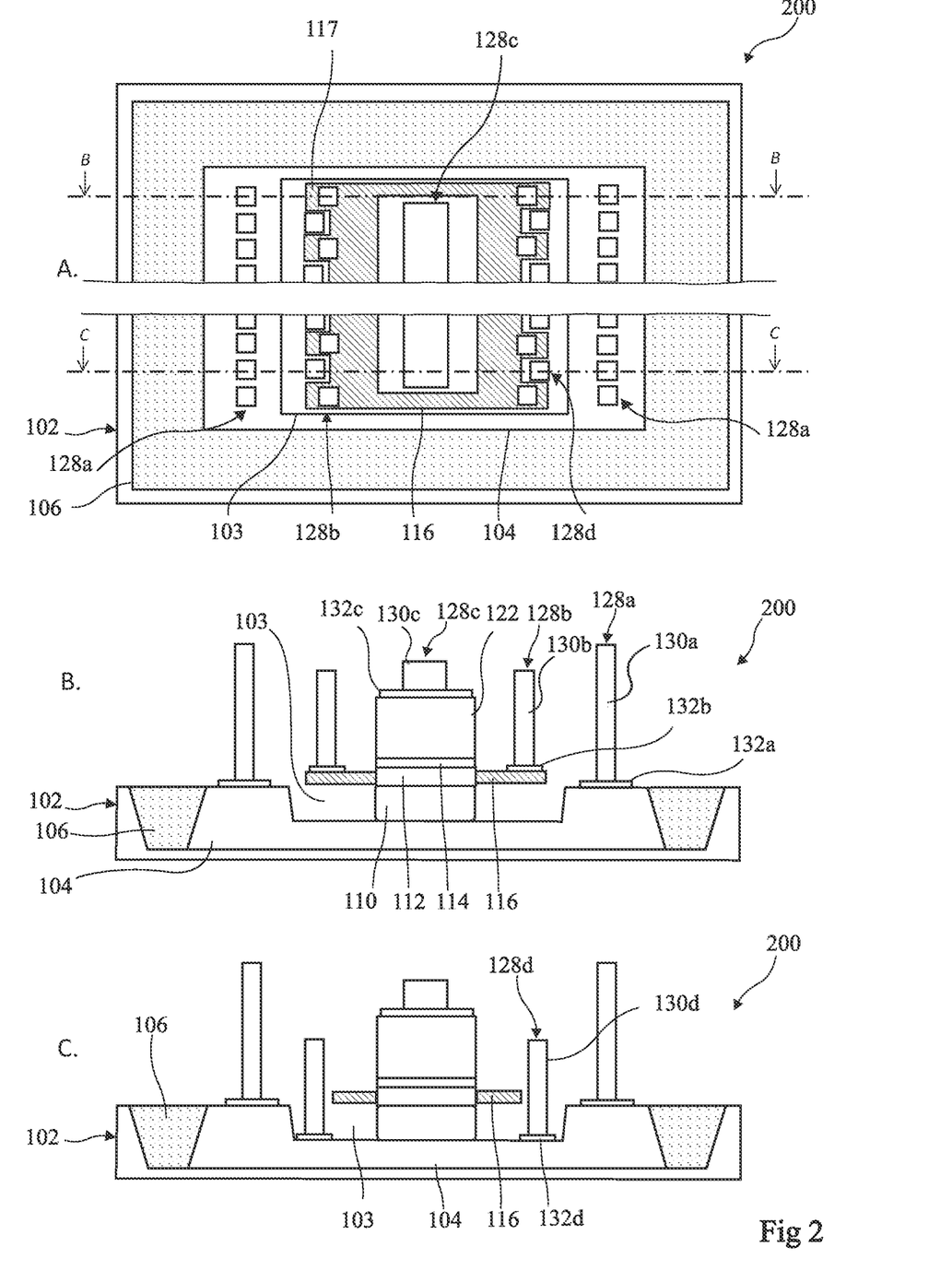
FIG. 2 shows a top view and two cross-section views, partial and simplified, of an embodiment of a bipolar transistor.

FIG. 2 shows a top view A and two cross-section views B and C, partial and simplified, of an embodiment of a bipolar transistor 200.

More particularly, view A is a top view of transistor 200 and views B and C are two cross-section views of transistor 200. View B is a view along the cross-section plane BB of view A and view C is a view along the cross-section plane CC of view A.

The transistor 200 illustrated in FIG. 2 comprises elements similar to the elements of transistor 100 described hereabove in relation with FIG. 1. These elements will not be described again hereafter and only the differences between transistors 100 and 200 will be highlighted.

To decrease the stray capacitances and the parasitic resistances which are present, transistor 200 comprises, instead of insulating trench 106, an insulating trench 103 buried in well 104. Insulating trench 103, for example, forms a super shallow trench insulation (SSTI). Trench 103, for example, has a depth in the range from approximately 25 nm to 100 nm, preferably in the order of 50 nm. Insulating trench 103 has, in top view, for example, a square or rectangular shape. Insulating trench 103 may, as a variant, have in top view a circular, triangular, or any shape. Insulating trench 103 thus forms a ring around the second portion 110 of the collector.

According to the embodiment illustrated in FIG. 2, insulating trench 103 is filled with air, with a gas, or with a partial vacuum.

Trench 106 enables an insulation of the transistor 200 to be kept, but it is displaced so that it crosses substrate 102 and surrounds well 104. Insulating peripheral trench 106 thus forms a ring around well 104.

Trench 106 has, according to the embodiment illustrated in FIG. 2, for example, a depth greater than the depth of trench 103. The depth of trench 106 is, for example, in the range from approximately 50 nm to approximately 150 nm. The depth of trench 106 is, for example, in the order of 100 nm.

The base of transistor 200 comprises a first central portion 112 and a second portion corresponding to the conduction elements 116 discussed in relation with FIG. 1. The second portion has, according to the embodiment illustrated in FIG. 2, a comb-shaped structure. In other words, the second portion 116 of the base comprises on two of its sides, preferably opposite, fingers or teeth 117 extending parallel to the upper surface of substrate 102. In other words, the second portion 116 of the base comprises, on two of its sides, fingers 117 extending orthogonally to the direction of the base stack, the second portion 110 of the collector, and emitter 122.

First portion 104 is, for example, buried at a depth in the range from approximately 100 to approximately 200 nm. Trench 106, for example, has a height in the range from approximately 50 to approximately 150 nm.

According to the embodiment illustrated in FIG. 2, the second portion 110 of the collector, the first portion 112 of the base, and layer 114 have substantially equal horizontal dimensions, that is, in top view.

Transistor 200 comprises contacts 128 similar to the contacts 128 of transistor 100 discussed in relation with FIG. 1, with the difference that they are positioned differently at the surface of transistor 200. Transistor 200 thus comprises contacts 128a, 128b, 128c, 128d for example, each comprising a conductive via 130a, 130b, 130c, 130d, and a contact pad 132a, 132b, 132c, 132d allowing an electric contact between different portions of transistor 200 and outer elements, for example, via an interconnection network. More particularly, contacts 128a are located on substrate 102 to form an electric contact with the first portion 104 of the collector. Other contacts 128b are formed on the fingers 117 of the second portion 116 of the base to form an electric contact with the base. Another contact 128c is formed on emitter 122 to form an electric connection with the emitter. Other contacts 128d are formed on the first portion 104 of the collector, in trench 103 and between two fingers 117, to form an electric connection with the emitter.

As an example, transistor 200 comprises as many contacts 128b as there are fingers 117 so that each finger 117 is partly covered with a contact 128b. As a variant, only some of fingers 117 are covered with a contact 128a. As an example, transistor 200 comprises one less contact 128d than there are fingers 117. Generally, transistor 200 comprises a number of contacts 128d smaller than or equal to the number of fingers 117.

As an example, transistor 200 comprises a contact 128a at the surface of each contact 128b and 128d. As a variant, the transistor comprises a contact 128a at the surface of all or part of fingers 117 and/or a contact 128a at the surface of all or part of the openings between two fingers 117.

The transistor 200 illustrated in FIG. 2 corresponds to a very simplified version of the improvement of the transistor 100 illustrated in FIG. 1. Thus, certain layers have not been shown in FIG. 2 but are preferably present.

Figure 3:
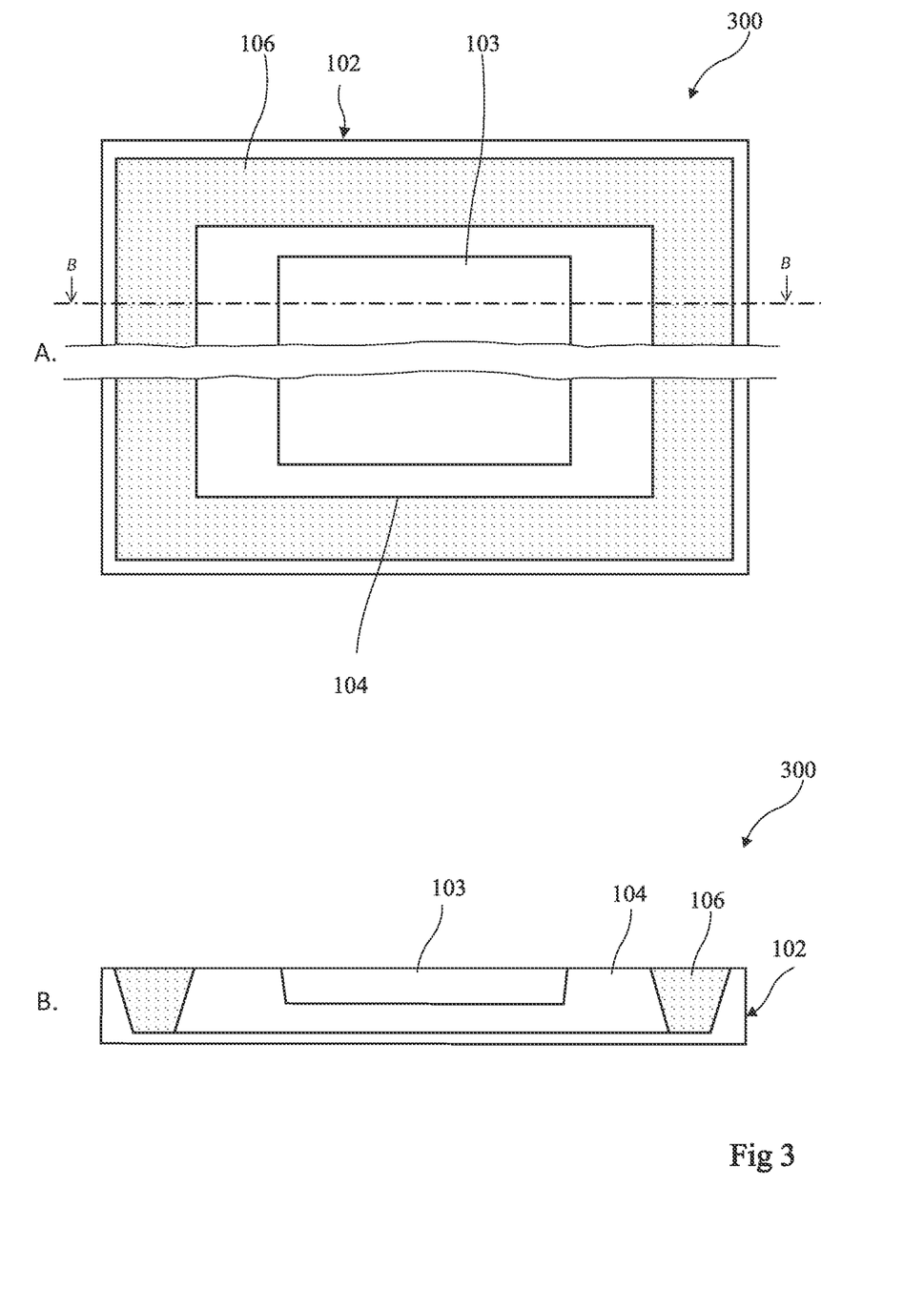
FIG. 3 shows a top view and a cross-section view, partial and simplified, of a step of an implementation mode of a method of forming the transistor illustrated in FIG. 2.

FIG. 3 shows a top view and a cross-section view, partial and simplified, of a step of an implementation mode of a method of forming the transistor 200 illustrated in FIG. 2.

More particularly, FIG. 3 illustrates two views of an initial structure 300 for the forming of transistor 200. The view A corresponds to the top view of structure 300 and the view B corresponds to the cross-section view of structure 300 along the cross-section plane BB of view A.

Structure 300 comprises substrate 102 where the first portion 104 of the collector, first insulating trench 106, and second insulating trench 103 are formed. The first portion 104 of the collector is buried in substrate 102. Trench 106 is formed to surround first portion 104 and trench 103 is formed in first portion 104.

According to the embodiment illustrated in FIG. 3, trench 103 is filled with an insulating material, for example, an oxide. According to the embodiment illustrated in FIG. 3, insulating trench 103 has, in top view (view A), a rectangular shape. As a variant, the insulating trench has a circular, square, triangular, or oval shape.

Figure 4:
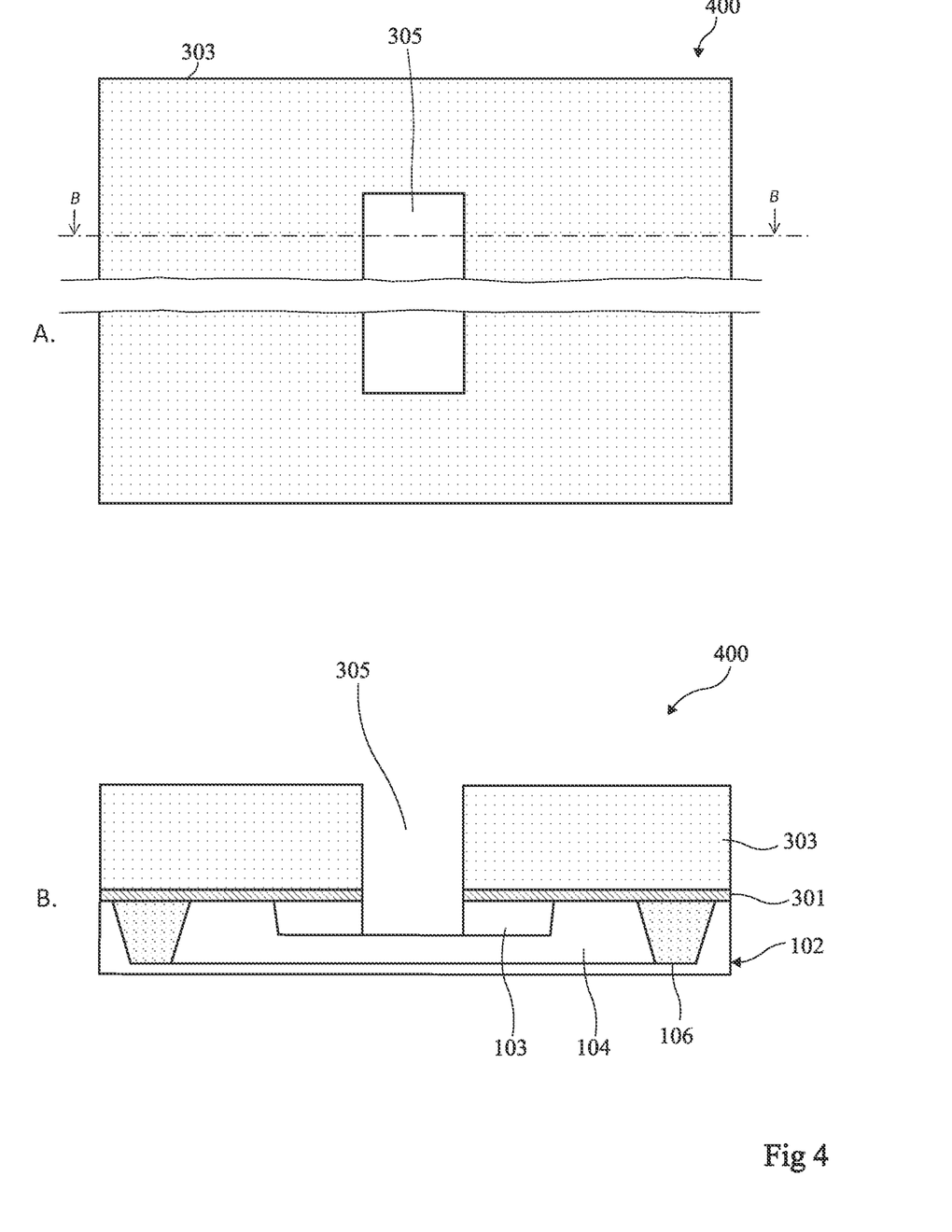
FIG. 4 shows a top view and a cross-section view, partial and simplified, of another step of an embodiment of the method of forming the transistor illustrated in FIG. 2.

FIG. 4 shows a top view and a cross-section view, partial and simplified, of another step of an implementation mode of the method of forming the transistor 200 illustrated in FIG. 2.

More particularly, FIG. 4 illustrates a structure 400 obtained at the end of a step of deposition of a layer 301 and of a stack 303 at the surface of the structure 300 illustrated in FIG. 3 and a step of etching the deposited layers. FIG. 4 illustrates two views of structure 400. The view A corresponds to the top view of structure 400 and the view B corresponds to the cross-section view of structure 400 along the cross-section plane BB of view A.

According to the implementation mode illustrated in FIG. 4, the layer 301 of a material forming the second portion 116 of the base is deposited in full plate fashion at the surface of structure 300 (FIG. 3). Layer 301 thus covers insulating trench 106, the first portion 104 of the collector, and insulating trench 103.

According to the implementation mode illustrated in FIG. 4, the deposition of layer 301 is followed by the deposition of stack 303 at the surface of layer 301, that is, on top of and in contact with the upper surface of layer 301.

Stack 303 is preferably multilayer.

The depositions of layer 301 and of stack 303 are, for example, achieved by chemical vapor deposition (CVD) techniques and, preferably, by a plasma-enhanced chemical vapor deposition (PECVD) technique.

The depositions of layer 301 and of stack 303 are followed by the forming of an opening 305. Opening 305, for example, extends from the upper surface of stack 303, through stack 303, layer 301, and insulating trench 103 to expose to a portion of the upper surface of the first portion 104 of the collector. Opening 305 has, for example, a rectangular shape in top view.

Opening 305 is, as an example, formed by photolithographic etching, that is, an organic resin mask having an opening identical to the desired opening 305 is formed at the surface of the structure, by photolithography. Layers 303, 301, and 104 are then etched to expose a portion of the upper surface of the first portion 104 of the collector and to form opening 305. The horizontal dimensions of opening 305, that is, the dimensions in top view, substantially correspond to the dimensions of the second portion 110 of the collector which is desired to be formed.

Figure 5:
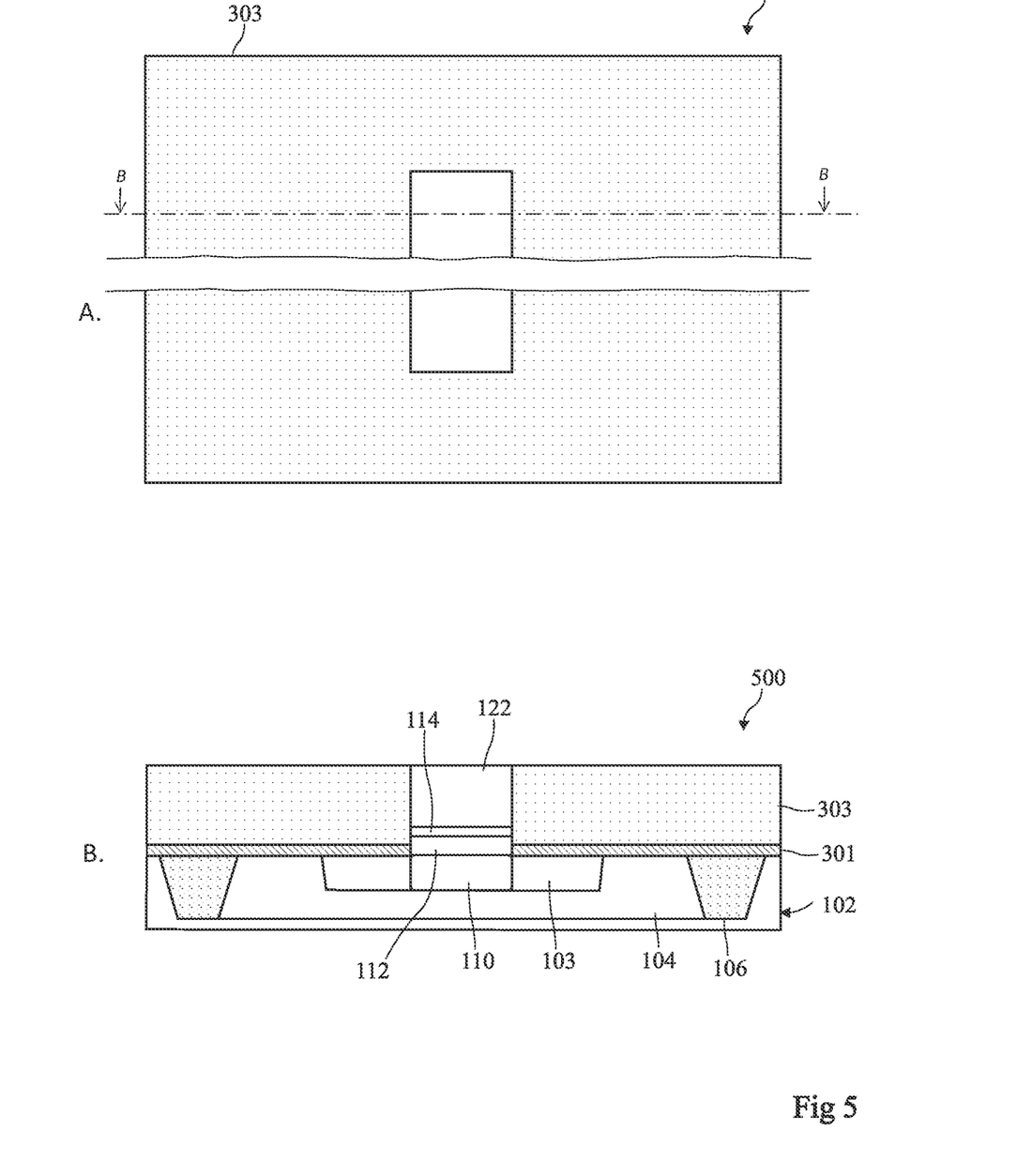
FIG. 5 shows a top view and a cross-section view, partial and simplified, of still another step of an embodiment of the method of forming the transistor illustrated in FIG. 2.

FIG. 5 shows a top view and a cross-section view, partial and simplified, of still another step of an implementation mode of the method of forming the transistor 200 illustrated in FIG. 2.

More particularly, FIG. 5 illustrates a structure 500 obtained at the end of a step of forming of the second portion 110 of the collector, of the first portion 112 of the base, of layer 114, and of emitter 122 inside and on top of the structure 400 illustrated in FIG. 4. FIG. 5 illustrates two views of structure 500. The view A corresponds to the top view of structure 500 and the view B corresponds to the cross-section view of structure 500 along the cross-section plane BB of view A.

According to the implementation mode illustrated in FIG. 5, the second portion 110 of the collector, the first portion 112 of the base, layer 114, and emitter 122 are successively formed by epitaxy in opening 305.

In other words, the second portion 110 of the collector is formed in opening 305 on top of and in contact with the upper surface of the first portion 104 of the collector. The lateral surfaces of the second portion 110 of the collector are thus in contact with the filling material of trench 103. Preferably, the second portion 110 of the collector is formed by a method comprising at least an etching of a semiconductor material and an epitaxial growth. Thus, during the step resulting in structure 500, stack 303 is partially etched and the second portion 110 of the collector is formed by epitaxial growth. Preferably, the thickness of the second portion 110 of the collector is in the range from approximately 70 nm to 110 nm, preferably in the order of 90 nm.

The first portion 112 of the base is preferably formed in opening 305 on top of and in contact with the upper surface of the second portion 110 of the collector. The first portion 112 of the base has a thickness, for example, in the range from approximately 18 nm to 26 nm, preferably in the order of 22 nm.

Layer 114 is preferably formed in opening 305 on top of and in contact with the upper surface of the first portion 112 of the base. Layer 114 has, for example, a thickness in the range from 10 nm to 20 nm, preferably in the order of 15 nm.

Emitter 122 is preferably formed in opening 305 on top of and in contact with the upper surface of layer 114.

Layers 110, 112, 114, and 122 are formed in opening 305 (FIG. 4). They are thus all laterally aligned. In other words, all layers 110, 112, 114, 122 extend horizontally on one another and this, to be in contact with the lateral edges of layer 303 in opening 305. The above-mentioned layers are thus perfectly laterally aligned. An advantage of this implementation mode is that a subsequent etch step is not necessary to align the lateral edges of layers 110, 112, 114, and 122.

Figure 6:
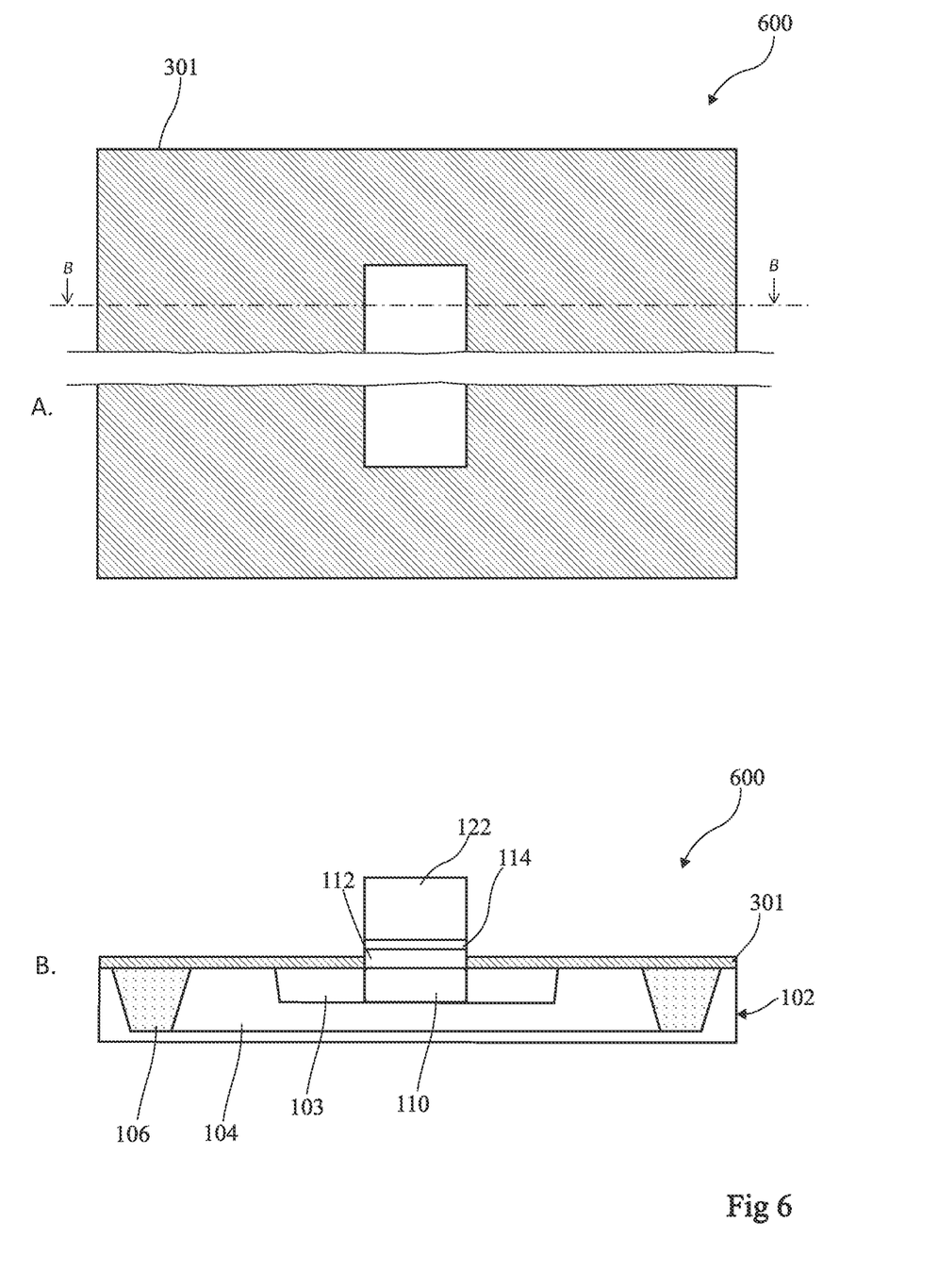
FIG. 6 shows a top view and a cross-section view, partial and simplified, of still another step of an embodiment of the method of forming the transistor illustrated in FIG. 2.

FIG. 6 shows a top view and a cross-section view, partial and simplified, of still another step of an implementation mode of the method of forming the transistor 200 illustrated in FIG. 2.

More particularly, FIG. 6 illustrates a structure 600 obtained at the end of an optional step of removal of stack 303 of the structure 500 illustrated in FIG. 5. FIG. 6 illustrates two views of structure 600. The view A corresponds to the top view of structure 600 and the view B corresponds to the cross-section view of structure 600 along the cross-section plane BB of view A.

The different steps mentioned in relation with FIG. 5 require steps of etching of stack 303 for the forming of elements 110, 112, 114, and 122. At the end of these steps, if all or part of stack 303 persists, it is removed.

Figure 7:
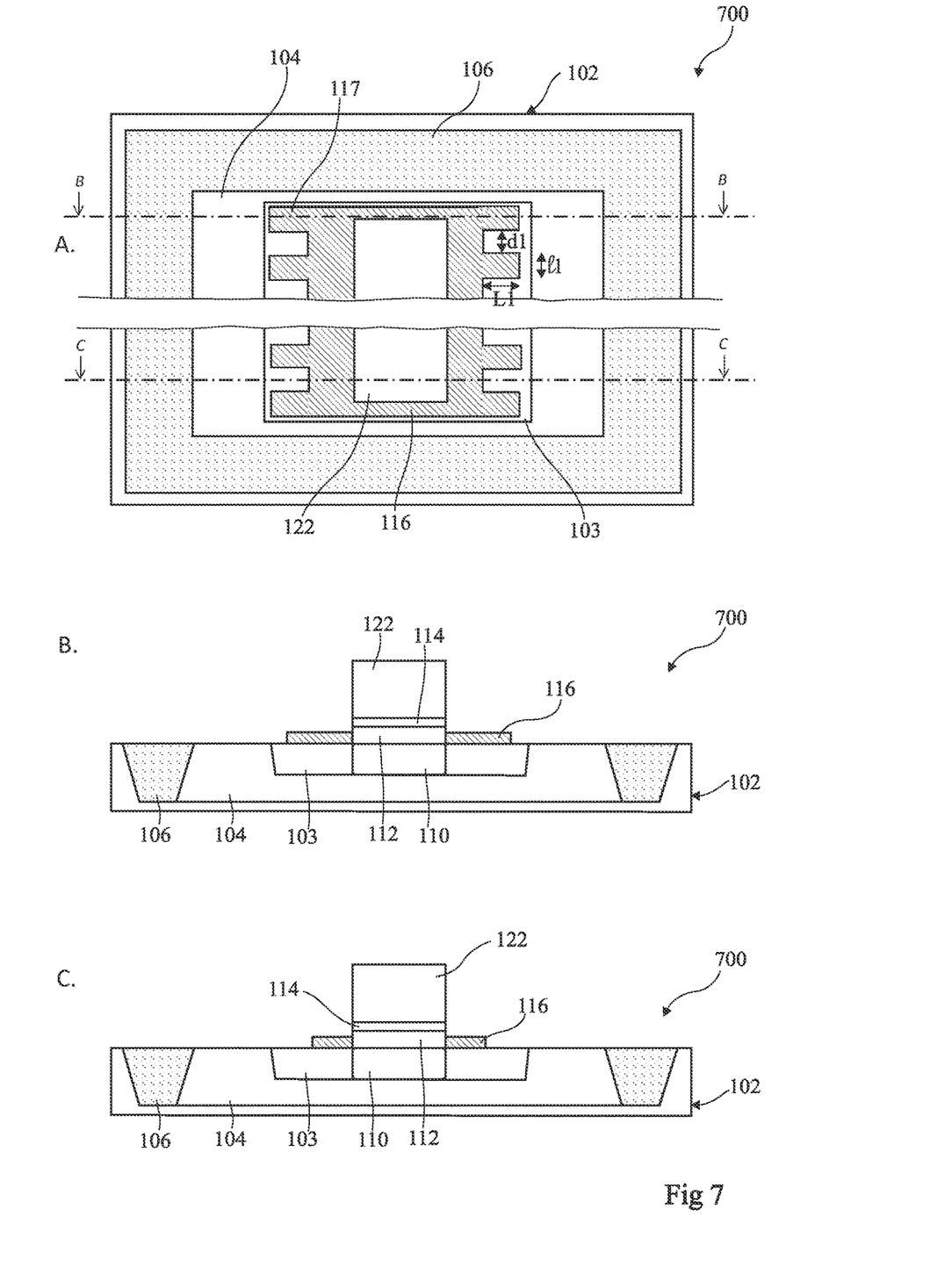
FIG. 7 shows a top view and two cross-section views, partial and simplified, of still another step of an embodiment of the method of forming the transistor illustrated in FIG. 2.

FIG. 7 shows a top view and two cross-section views, partial and simplified, of still another step of an implementation mode of the method of forming the transistor 200 illustrated in FIG. 2.

More particularly, FIG. 7 illustrates a structure 700 obtained at the end of a step of etching of the second portion 116 of the base of the structure 600 illustrated in FIG. 6. FIG. 7 illustrates three views of structure 700. The view A corresponds to the top view of structure 700 and two views A and B correspond to cross-section views of structure 700 respectively along the cross-section plane BB of view A and the cross-section plane CC of view A.

The second portion 116 of the base is etched to structure the layer and to form on two of its sides, preferably, two opposite sides, combs. In other words, second portion 116 is etched to form fingers 117 having a width l1 and a length L1. Fingers 117 are, for example, spaced apart two by two by a distance d1. The number of fingers 117 per side of second portion 116 may vary, it is preferably greater than 3.

Width l1 is, for example, in the range from approximately 80 nm to 150 nm. Length L1 is, for example, in the range from approximately 135 nm to 300 nm. Distance d1 is, for example, in the range from approximately 100 nm to 1.3 µm.

At the end of the forming of the second portion 116 of the base, the trench 103 of structure 700 is etched, that is, the filling material is removed from trench 103.

Trench 103 is, for example, etched by a chemical wet etching technique during which structure 700 is immersed in a solution, for example, based on hydrofluoric acid, on hydrochloric acid, and/or of citric acid.

Contacts 128a, 128b, 128c, 128d are then respectively formed on the first portion 104 of the collector, outside of trench 103, on the second portion 116 of the base, on emitter 122, and on the first portion 104 of the collector, in trench 103.

As an example, contacts 128a are formed on top of and in contact with first portion 104 of the collector outside of trench 103 and on two of the sides around trench 103. Contacts 128b are, for example, formed on top of and in contact with the fingers 117 of the second portion 116 of the base. For example, each finger 117 of the second portion 116 of the base receives a contact 128b. Contact 128c is, for example, formed on top of and in contact with emitter 122. Contacts 128d are, for example, formed on top of and in contact with the first portion 104 of the collector in trench 103. Preferably, contacts 128d are formed in trench 103 between two fingers 117 of the second portion 116 of the base and between two contacts 128b. Contacts 128a are, as an example, aligned with contacts 128b and 128d.

The final structure corresponds to the transistor 200 illustrated in FIG. 2, from structure 700 and after the step of etching of trench 103 and the step of deposition of contacts 128a, 128b, and 128c.

Figure 8:
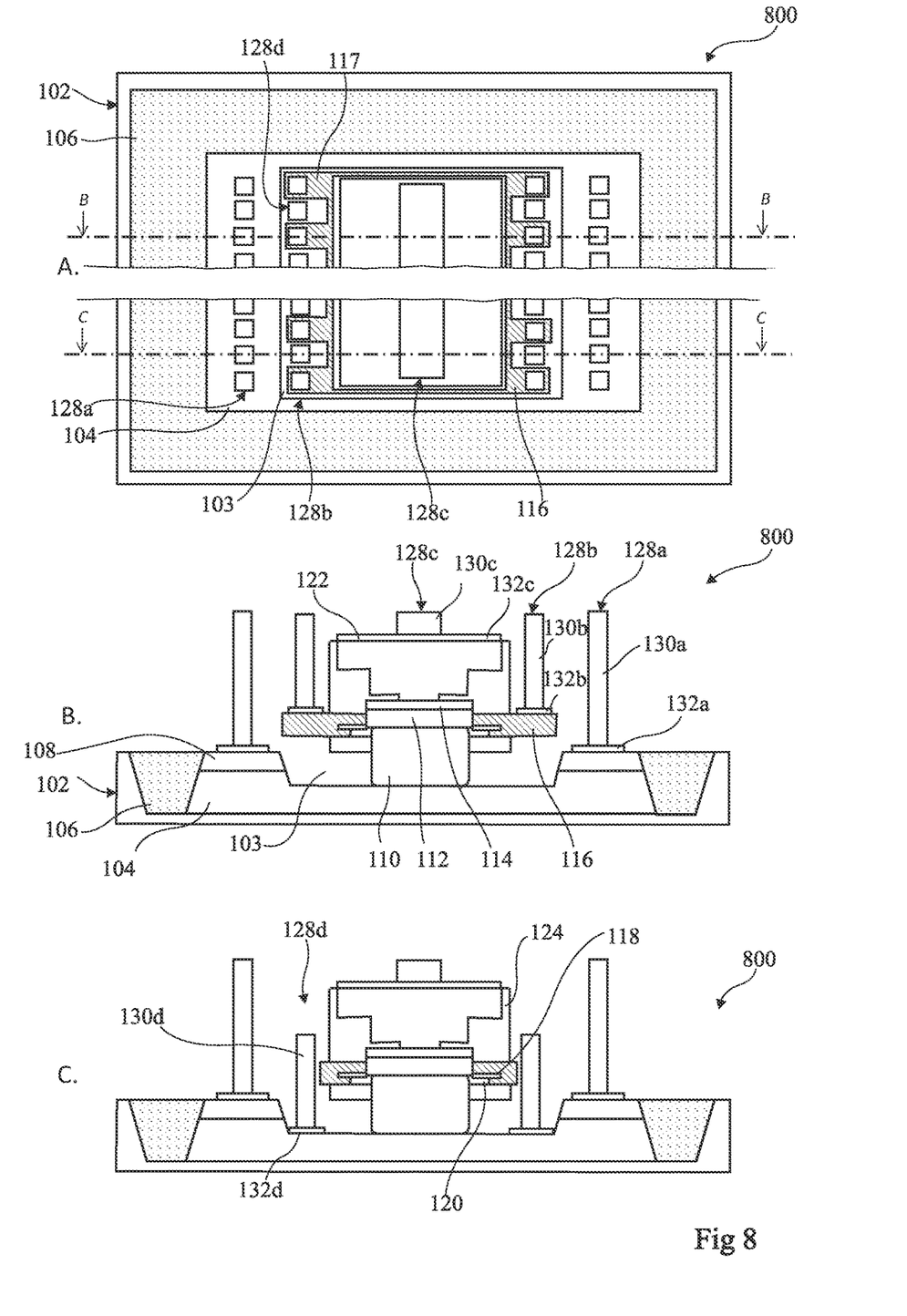
FIG. 8 shows a top view and two cross-section views, partial and simplified, of another embodiment of a bipolar transistor.

FIG. 8 shows a top view and two cross-section views, partial and simplified, of another embodiment of a bipolar transistor 800.

The transistor 800 illustrated in FIG. 8 is an alternative embodiment of the transistor 200 illustrated in FIG. 2. More particularly, view A is a top view of transistor 800 and views B and C are two cross-section views of transistor 800. View B is a view along the cross-section plane BB of view A and view C is a view along the cross-section plane CC of view A.

The transistor 800 illustrated in FIG. 8 comprises all the elements of transistor 200, including the elements of transistor 100 which are not mentioned in relation with FIG. 2.

The second portion 116 of the base is then insulated from the second portion 110 of the collector, for example, by an insulating element 118 and an air pocket 120, for example, formed during the epitaxy of the second portion 110 of the collector.

Emitter 122 is insulated from the second portion 116 of the base by an insulating region 124.

Figure 9:
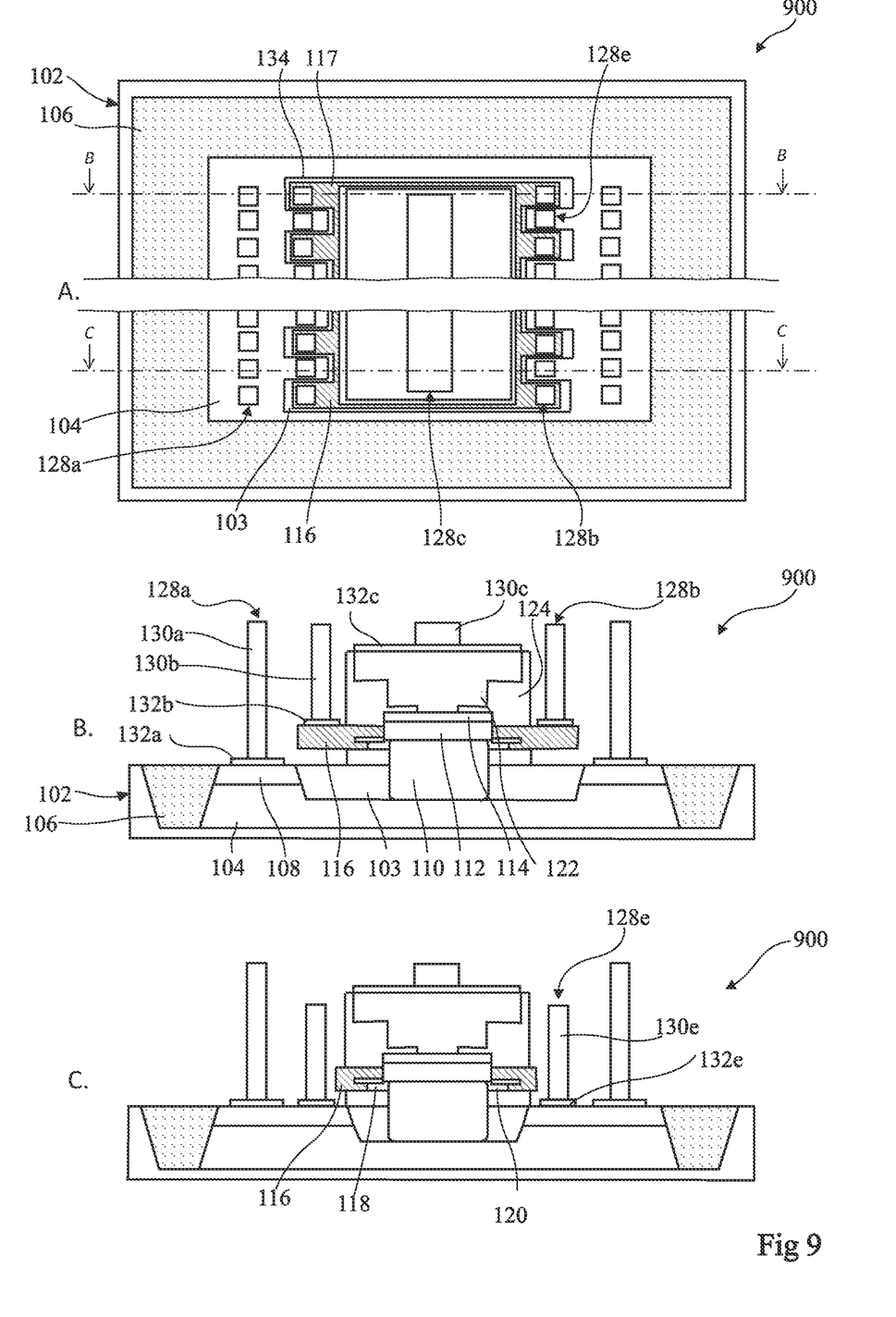
FIG. 9 shows a top view and two cross-section views, partial and simplified, of still another embodiment of a bipolar transistor.

FIG. 9 shows a top view and two cross-section views, partial and simplified, of still another embodiment of a bipolar transistor 900.

View A is a top view of transistor 900 and views B and C are two cross-section views of transistor 900. View B is a view along the cross-section plane BB of view A and view C is a view along the cross-section plane CC of view A.

The transistor 900 illustrated in FIG. 9 is an alternative embodiment of the transistors 200 and 800 illustrated in FIGS. 2 and 8. More particularly, the transistor 900 illustrated in FIG. 9 differs from transistor 800 in that trench 103 is filled with a material, for example, an oxide.

According to the embodiment illustrated in FIG. 9, trench 103 of the transistor comprises fingers 134 on two of its sides. Trench 103 accordingly has a structure having patterns similar to the patterns of the structure of the second portion 116 of the base. Fingers 117 and fingers 134 are stacked so that each finger 117 partly covers a finger 134 and that each finger 134 is partly covered with a finger 117.

According to the embodiment illustrated in FIG. 9, transistor 900 comprises no contacts 128d. Transistor 900 may however optionally comprise contacts 128e, for example, each comprising a conductive via 130e and a contact pad 132e. Contacts 128e are preferably formed on portion 108 and between two fingers 134 to form an electric connection with the collector.

As an example, transistor 900 comprises one less contact 128e than fingers 134. Generally, transistor 900 comprises a number of contacts 128e smaller than or equal to the number of fingers 134.

Figure 10:
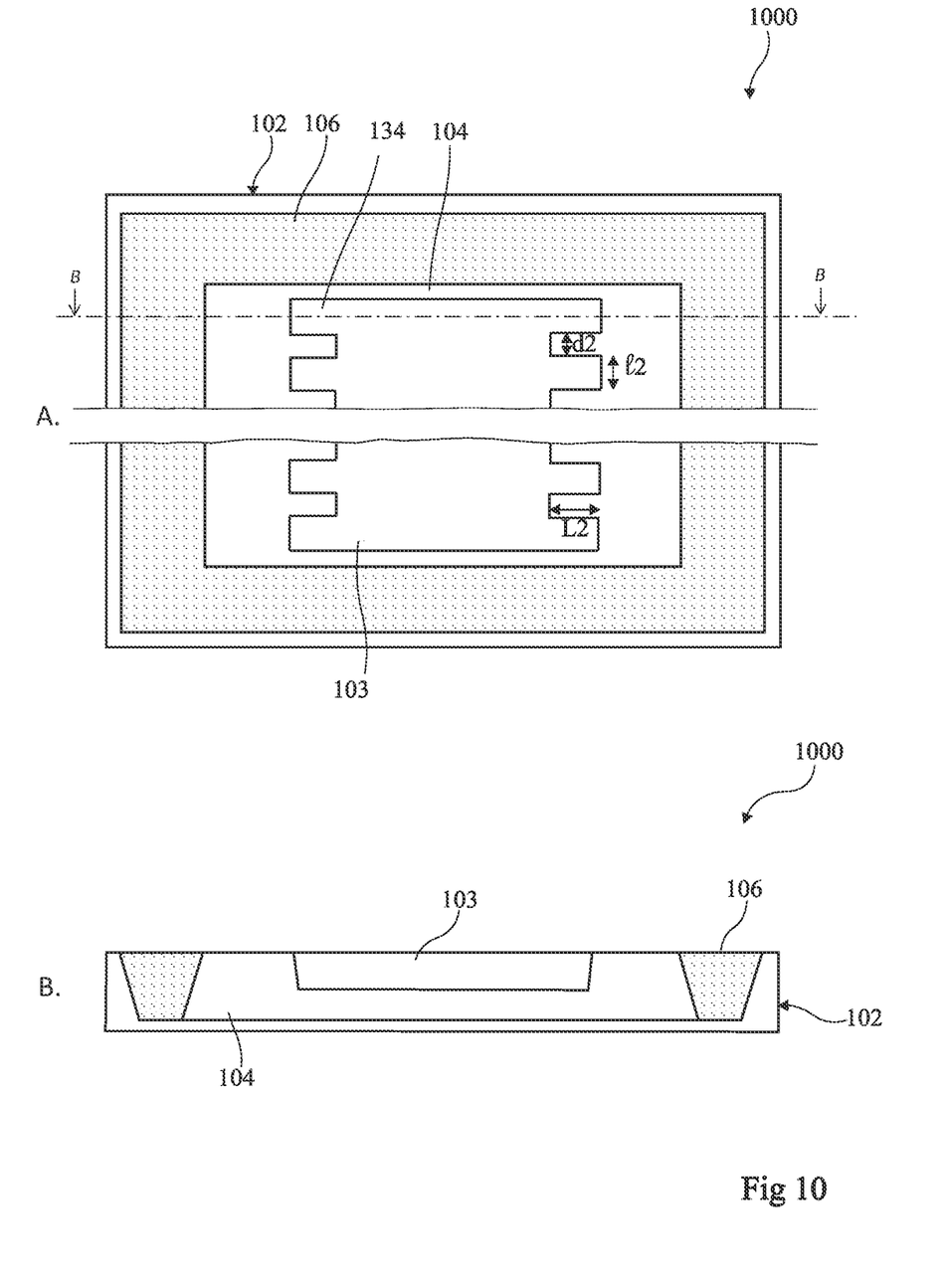
FIG. 10 shows a top view and a cross-section view, partial and simplified, of a step of an implementation mode of a method of forming the transistor illustrated in FIG. 9.

FIG. 10 shows a top view and a cross-section view, partial and simplified, of a step of an implementation mode of a method of forming the transistor illustrated in FIG. 9.

More particularly, FIG. 10 illustrates an initial structure 1000 of the implementation mode of the method of forming the transistor 900 illustrated in FIG. 9. More particularly, FIG. 10 illustrates two views of a structure 1000. The view A corresponds to the top view of structure 1000 and the view B corresponds to the cross-section view of structure 1000 along the cross-section plane BB of view A.

Similarly to the structure 300 illustrated in FIG. 3, structure 1000 comprises substrate 102, having the first portion 104 of the collector, the first insulating trench 106, and the second insulating trench 103 formed therein.

According to the embodiment illustrated in FIG. 10, trench 103 is etched to structure the layer and form combs on two of its sides. In other words, trench 103 is etched to form fingers 134 having a width l2 and a length L2. Fingers 134 are, for example, spaced apart two by two by a distance d2. The number of fingers 134 per side of trench 103 may vary, it is preferably greater than 3 and is, preferably, identical to the number of fingers 117 per side of the second portion 116 of the base. Trench 103 is filled with an insulating material, for example, an oxide.

Width l2 is greater than width l1 and is, for example, in the range from approximately 80 nm to 150 nm. Length L2 is greater than length L1 and is, for example, in the range from approximately 135 nm to 300 nm. Distance d2 is greater than distance d1 and is, for example, in the range from approximately 100 nm to 1.3 µm.

The method of forming the transistor 900 illustrated in FIG. 9 is similar to the method of forming the transistor 200 described in relation with FIGS. 3 to 7, with the difference that it is based on the initial structure 1000 and not on structure 300.

Figure 11:
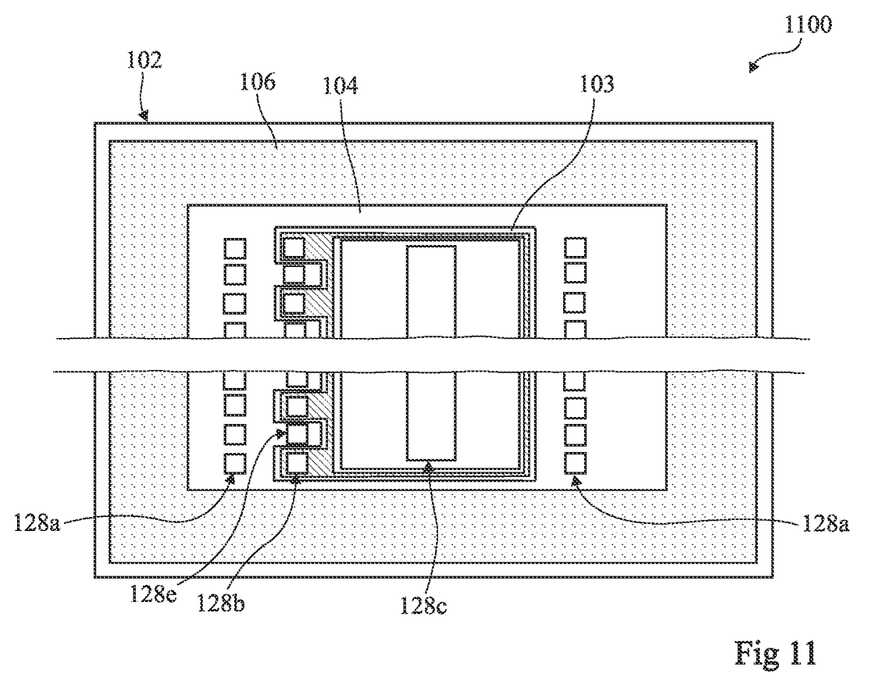
FIG. 11 shows a partial simplified top view of still another embodiment of a bipolar transistor.

FIG. 11 shows a partial simplified top view of still another embodiment of a bipolar transistor 1100.

More particularly, transistor 1100 is similar to the transistor 900 illustrated in FIG. 9, with the difference that it only comprises fingers 117 and fingers 134 on a single side. In other words, transistor 1100 is similar to transistor 900, with the difference that the second portion 116 of the base and trench 103 are only structured on one of their sides.

Thus, transistor 1100 only comprises contacts 128b and 128e on one of its sides. Transistor 110 however optionally comprises contacts 128a on one or two of its sides.

Figure 12:
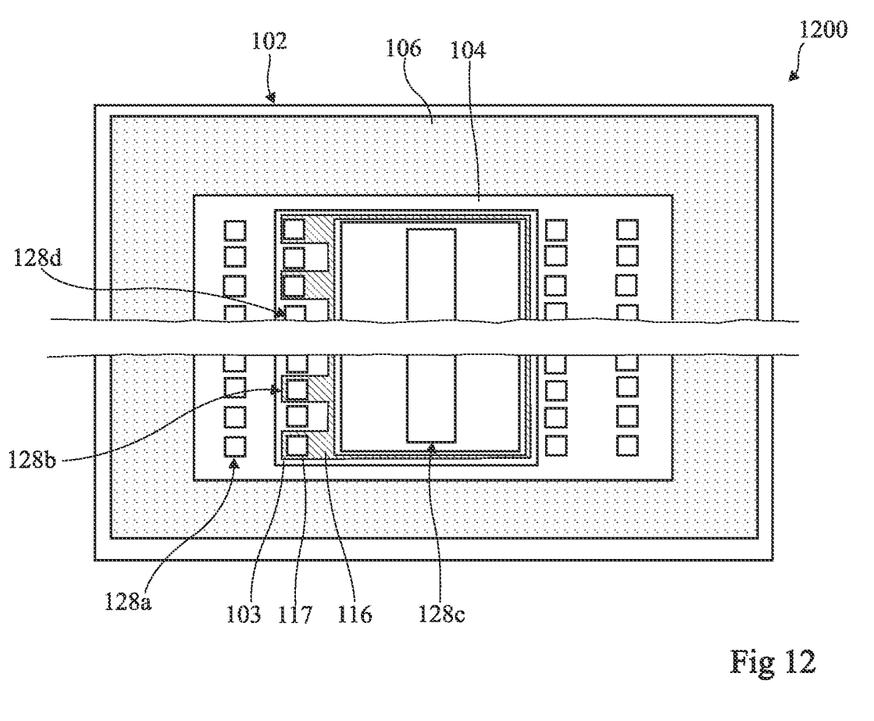
FIG. 12 shows a partial simplified top view of still another embodiment of a bipolar transistor.

FIG. 12 shows a partial simplified top view of still another embodiment of a bipolar transistor 1200.

More particularly, transistor 1200 is similar to the transistor 200 illustrated in FIG. 2, with the difference that it only comprises fingers 117 on a single side. In other words, transistor 1200 is similar to transistor 200, with the difference that the second portion 116 of the base is only structured on one of its sides.

Thus, transistor 1200 only comprises contacts 128b and 128d on one of its sides. Transistor 1200 however optionally comprises contacts 128a on one or two of its sides.

An advantage of the described embodiments, and particularly of the comb structure of the base, is that they enable to minimize the stray capacitances between the collector and the base.

Another advantage of the described embodiments is that they enable to decrease the parasitic collector resistance.

The described embodiments are particularly adapted to the forming of transistors for very high frequency applications of several hundreds of GHz.

It should be noted that the described embodiments apply as well to the forming of PNP-type transistors as to that of NPN-type transistors.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

The invention claimed is:

1. A bipolar transistor, comprising:
   a stack of an emitter, a base, and a collector;
   wherein said base is structured to have a comb shape including fingers oriented to extend in a plane orthogonal to a stacking direction of the stack;
   a first peripheral insulating trench around said bipolar transistor and delimiting a semiconductor well forming a first portion of the collector; and
   a second insulating trench extending into said semiconductor well forming the first portion of the collector and delimiting at least the surface of a second portion of the collector;
   wherein the second insulating trench is filled with one of: air, a gas, or a partial vacuum.

2. The transistor according to claim 1, wherein the second insulating trench is shallower than the first peripheral insulating trench.

3. The transistor according to claim 1, wherein the second portion of the collector crosses the second insulating trench at its center, the second portion of the collector being in physical contact with the first portion of the collector.

4. The transistor according to claim 1, comprising contacts on top of and in contact with the emitter, with the base, and with the first portion of the collector.

5. The transistor according to claim 1, wherein a depth of the second insulating trench is in the order of 50 nm and wherein a depth of the first peripheral insulating trench is in the order of 100 nm.

6. The transistor according to claim 1, further comprising an electrical contact for said base, wherein the electrical contact is physically connected to the base at one or more of the fingers.

7. The transistor according to claim 1, wherein the base comprises:
   a central base portion overlying the collector; and
   a further base portion laterally in contact with the central base portion and which includes the comb shape with the fingers extending perpendicularly away from the central base portion.

8. A bipolar transistor, comprising:
   a semiconductor substrate;
   a first insulating trench extending into said semiconductor substrate;

a semiconductor well over said semiconductor substrate and laterally delimited by said first insulating trench, said semiconductor well forming a first portion of a collector for the bipolar transistor;

a second insulating trench extending into, but not completely through, said semiconductor well;

a second portion of the collector for the bipolar transistor positioned within the second insulating trench and in contact with the semiconductor well;

a base for the bipolar transistor, said base including a first base portion stacked on top of the second portion of the collector and a second base portion structured to have a comb shape including fingers extending laterally away from the first base portion over the second insulating trench; and an emitter for the bipolar transistor, said emitter stacked on top of the first portion of the base;

wherein the second insulating trench is filled with one of: air, a gas, or a partial vacuum.

9. The transistor according to claim 8, wherein the second insulating trench is shallower than the first insulating trench.

10. The transistor according to claim 8, wherein second insulating trench shapes the semiconductor well forming said first portion of the collector to have a first part having a first thickness where the second portion of the collector for the bipolar transistor positioned and to have a second part having a second thickness greater than the first thickness that peripherally surrounds the second insulating trench.

11. The transistor according to claim 10, further comprising a collector electrical contact at the second part of the semiconductor well.

12. The transistor according to claim 10, wherein an upper surface of the second part of the semiconductor well is coplanar with an upper surface of an insulating material filling the first insulating trench.

13. The transistor according to claim 8, further comprising a base electrical contact at the fingers of the second base portion.

14. A bipolar transistor, comprising:
a stack of an emitter, a base, and a collector;
wherein said base is structured to have a comb shape including fingers oriented to extend in a plane orthogonal to a stacking direction of the stack;
a first peripheral insulating trench around said bipolar transistor; and
a second insulating trench delimiting at least the surface of the collector;
wherein the second insulating trench has a comb-shaped structure, with fingers of the second insulating trench being aligned with fingers of the base.

15. The transistor according to claim 14, wherein the second insulating trench is shallower than the first peripheral insulating trench.

16. The transistor according to claim 14, wherein the first peripheral insulating trench delimits a semiconductor well forming a first portion of the collector.

17. The transistor according to claim 16, wherein the second insulating trench extends into said semiconductor well forming the first portion of the collector.

18. The transistor according to claim 17, wherein the second insulating trench is filled with one of: air, a gas, or a partial vacuum.

19. The transistor according to claim 17, wherein the second insulating trench is filled with an oxide.

20. The transistor according to claim 16, wherein a second portion of the collector crosses the second insulating trench at its center, the second portion of the collector being in physical contact with the first portion of the collector.

21. The transistor according to claim 16, comprising contacts on top of and in contact with the emitter, with the base, and with the first portion of the collector.

22. The transistor according to claim 14, wherein a depth of the second insulating trench is in the order of 50 nm and wherein a depth of the first peripheral insulating trench is in the order of 100 nm.

23. The transistor according to claim 14, further comprising an electrical contact for said base, wherein the electrical contact is physically connected to the base at one or more of the fingers.

24. The transistor according to claim 14, wherein the base comprises:
a central base portion overlying the collector; and
a further base portion laterally in contact with the central base portion and which includes the comb shape with the fingers extending perpendicularly away from the central base portion.

25. A bipolar transistor, comprising:
a semiconductor substrate;
a first insulating trench extending into said semiconductor substrate;
a semiconductor well over said semiconductor substrate and laterally delimited by said first insulating trench, said semiconductor well forming a first portion of a collector for the bipolar transistor;
a second insulating trench extending into, but not completely through, said semiconductor well;
a second portion of the collector for the bipolar transistor positioned within the second insulating trench and in contact with the semiconductor well;
a base for the bipolar transistor, said base including a first base portion stacked on top of the second portion of the collector and a second base portion structured to have a comb shape including fingers extending laterally away from the first base portion over the second insulating trench; and
an emitter for the bipolar transistor, said emitter stacked on top of the first portion of the base;
wherein the second insulating trench has a comb-shaped structure, with fingers of the second insulating trench being aligned with fingers of the second portion of the base.

26. The transistor according to claim 25, wherein the second insulating trench is shallower than the first insulating trench.

27. The transistor according to claim 25, wherein second insulating trench shapes the semiconductor well forming said first portion of the collector to have a first part having a first thickness where the second portion of the collector for the bipolar transistor positioned and to have a second part having a second thickness greater than the first thickness that peripherally surrounds the second insulating trench.

28. The transistor according to claim 27, further comprising a collector electrical contact at the second part of the semiconductor well.

29. The transistor according to claim 27, wherein an upper surface of the second part of the semiconductor well is coplanar with an upper surface of an insulating material filling the first insulating trench.

30. The transistor according to claim 25, further comprising a base electrical contact at the fingers of the second base portion.

31. The transistor according to claim 25, wherein the second insulating trench is filled with one of: air, a gas, or a partial vacuum.

32. The transistor according to claim 25, wherein the second insulating trench is filled with an insulating material.

* * * * *